(12) United States Patent
Kim et al.

(10) Patent No.: US 6,839,288 B1
(45) Date of Patent: Jan. 4, 2005

(54) LATCH SCHEME WITH INVALID COMMAND DETECTOR

(75) Inventors: Jung Pill Kim, Cary, NC (US); Jonghee Han, Cary, NC (US); Stephen Camacho, Durham, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/706,146

(22) Filed: Nov. 12, 2003

(51) Int. Cl.[7] .............................................. G11C 7/00
(52) U.S. Cl. ................... 365/189.05; 365/195
(58) Field of Search ........................... 365/189.05, 195, 365/233; 326/93

(56) References Cited

U.S. PATENT DOCUMENTS 5,600,599 A * 2/1997 Nakayama et al. .... 365/189.05
6,137,744 A * 10/2000 Watanabe ................... 365/227
6,307,806 B1 * 10/2001 Tomita et al. .............. 365/233
6,477,093 B2 * 11/2002 Okuyama et al. ........... 365/195

* cited by examiner

Primary Examiner—Son Mai
(74) Attorney, Agent, or Firm—Moser, Patterson & Sheridan, L.L.P.

(57) ABSTRACT

Methods and circuits for reducing unnecessary changes to outputs of latch circuits are provided. Unnecessary changes to outputs of latch circuits may be reduced by preventing the outputs of the latch circuits from changing when an invalid command is detected. For some embodiments, an invalid command detector is provided that generates an invalid command signal used to inhibit latch circuits, in response to detecting an invalid command.

20 Claims, 10 Drawing Sheets

LATCH SCHEME WITH INVALID COMMAND DETECTOR

BACKGROUND OF THE INVENTION

1. Field of the Invention

The present invention generally relates to integrated circuit (IC) devices and, more particularly, to reducing current consumption by selectively preventing changes to outputs of latch circuits utilized in IC devices.

2. Description of the Related Art

In recent years, the demands for low-power and low-voltage memory have increased tremendously as portable and handheld devices, such as personal digital assistants (PDAs), cellular phones, and notebook computers have become increasingly popular. Simply put, the less power these devices consume, the longer they may operate off of their batteries and/or the size and weight of their batteries may be reduced, enhancing portability in either case.

Figure 1:
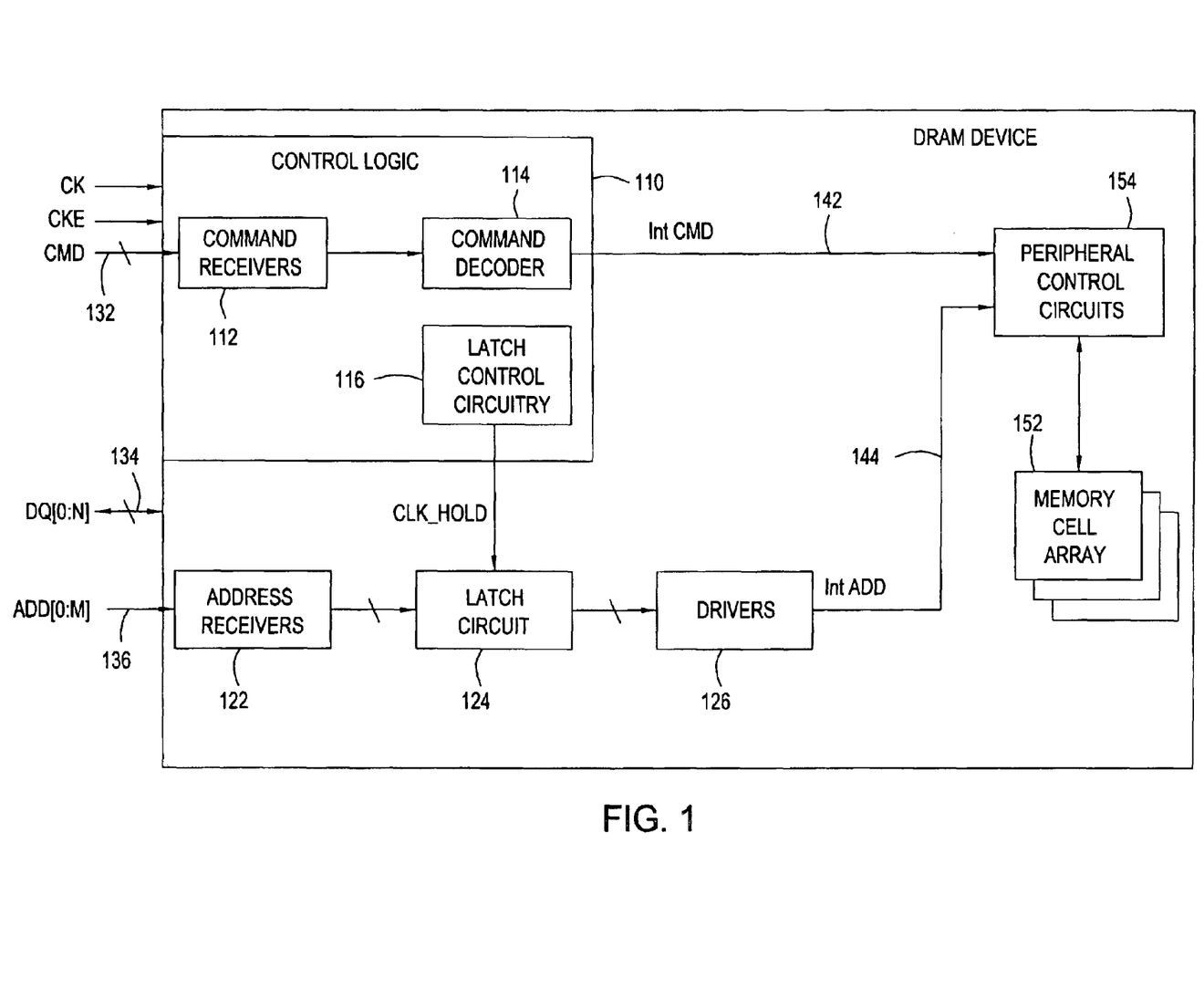
FIG. 1 illustrates a conventional memory device.

One of the more popular types of memory used in these devices, due to the available density, speed, and relatively low cost, is dynamic random access memory (DRAM). FIG. 1 illustrates an exemplary DRAM device 100 having a plurality of memory cell arrays 152. The DRAM device 100 is referred to as dynamic (as opposed to static) because the memory cells of the arrays 152 must be refreshed periodically (within a given retention time) in order to maintain data stored therein.

As illustrated, the DRAM device 100 includes control logic 110, which receives and processes commands (e.g., Read or Write commands) issued by an external device via a command bus 132 to access data in the memory cell arrays 152. The commands are received by command receivers 112, which output buffered command signals to a command decoder (typically on a rising edge of a clock signal CK when a clock enable signal CKE is asserted). The command decoder 114 decodes the command based on the state of the command signals and generates one or more corresponding internal command signals on an internal command bus 142. When commands are issued on the command bus 132, corresponding addresses (e.g., of a memory cell to be accessed) are driven on address bus 136.

Address signals from the address bus 136 are received by address receivers 122, which output buffered address signals to address latch circuits 124. Address signals output by the latch circuits are driven onto an internal address bus (IntADD) 144 by output drivers 126. As illustrated, the latch circuits 124 may be controlled by a signal (CLK_HOLD) generated by latch control circuitry 116, for example, as a delayed version of clock signal CK.

Figure 2A:
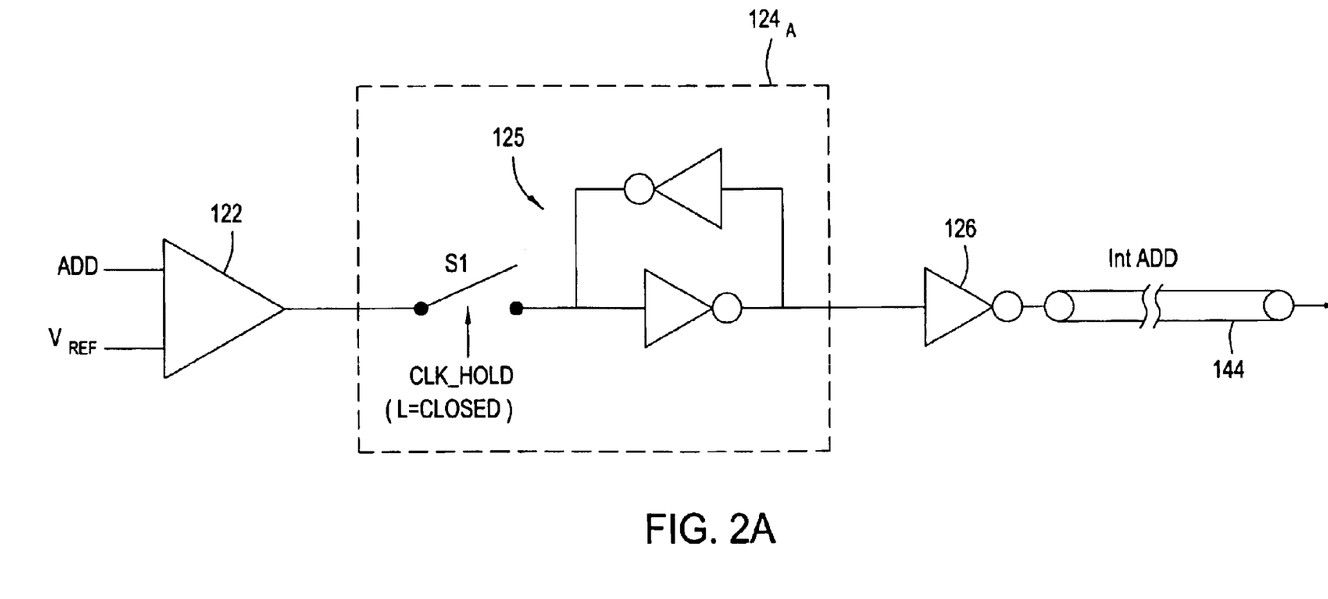
FIGS. 2A and 2B illustrate a conventional half latch circuit and a corresponding timing diagram, respectively.
Figure 2B:
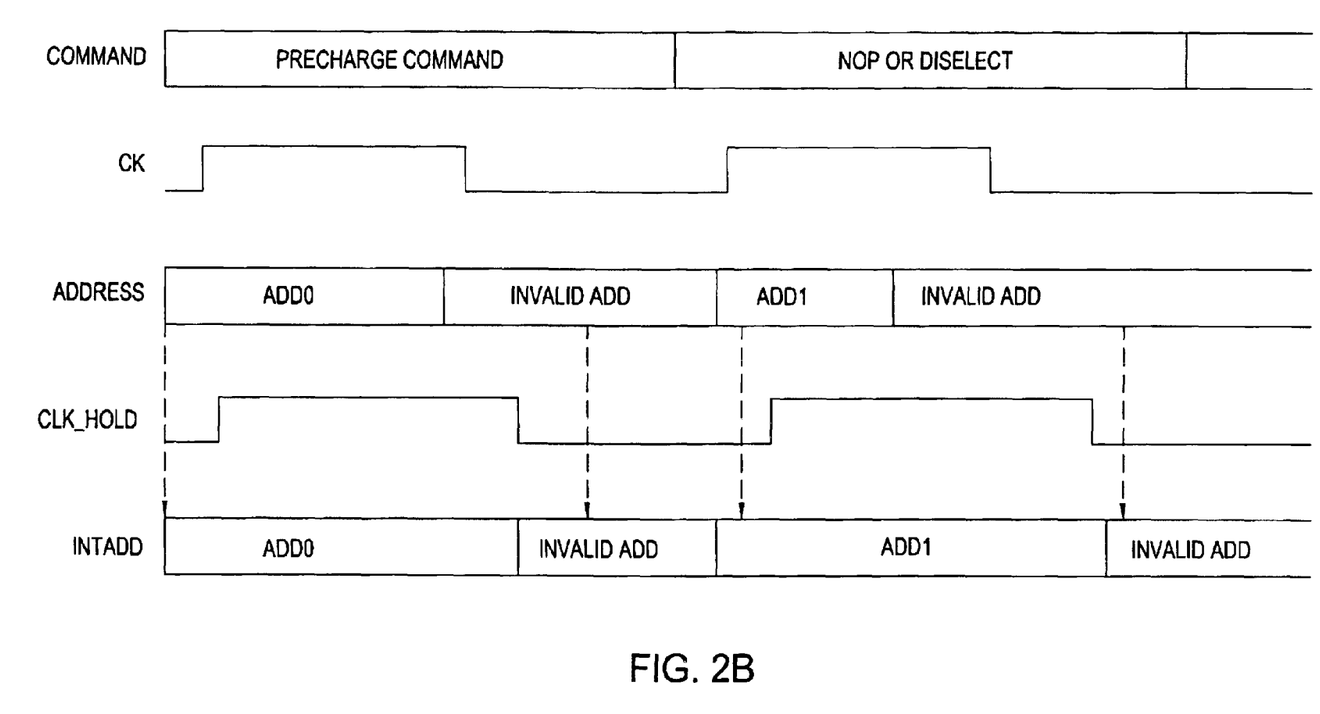

FIGS. 2A and 2B illustrate a schematic diagram of an exemplary latch circuit 124A and a corresponding timing diagram, respectively. As illustrated, CLK_HOLD controls a switch S1 that is closed when CLK_HOLD is low and open when CLK_HOLD is high. The latch circuit 124A may be referred to as a "half latch" circuit, because (as illustrated in FIG. 2B) data at the input is only latched in (by a pair of cross-coupled inverters 125) for half of a cycle, while CLK_HOLD is high. For the other half of the cycle, while CLK_HOLD is low, the data (e.g., an address signal) at the input is not latched, but rather applied continuously to the driver 126.

A number of disadvantages arise when utilizing this half latch scheme in a memory device, particularly when invalid addresses or commands are applied to the memory device, which may lead to unnecessary changing of logical states (i.e., toggling) of output drivers and increased power consumption. For example, again referring to FIG. 2B, if invalid addresses (INVALID_ADD) are applied to the address lines between valid addresses (ADD0 and ADD1) while CLK_HOLD is low, the driver 126 may toggle, resulting in significant power consumption, particularly considering lines of the internal address bus 144 may be relatively long with high associated capacitance.

Figure 3A:
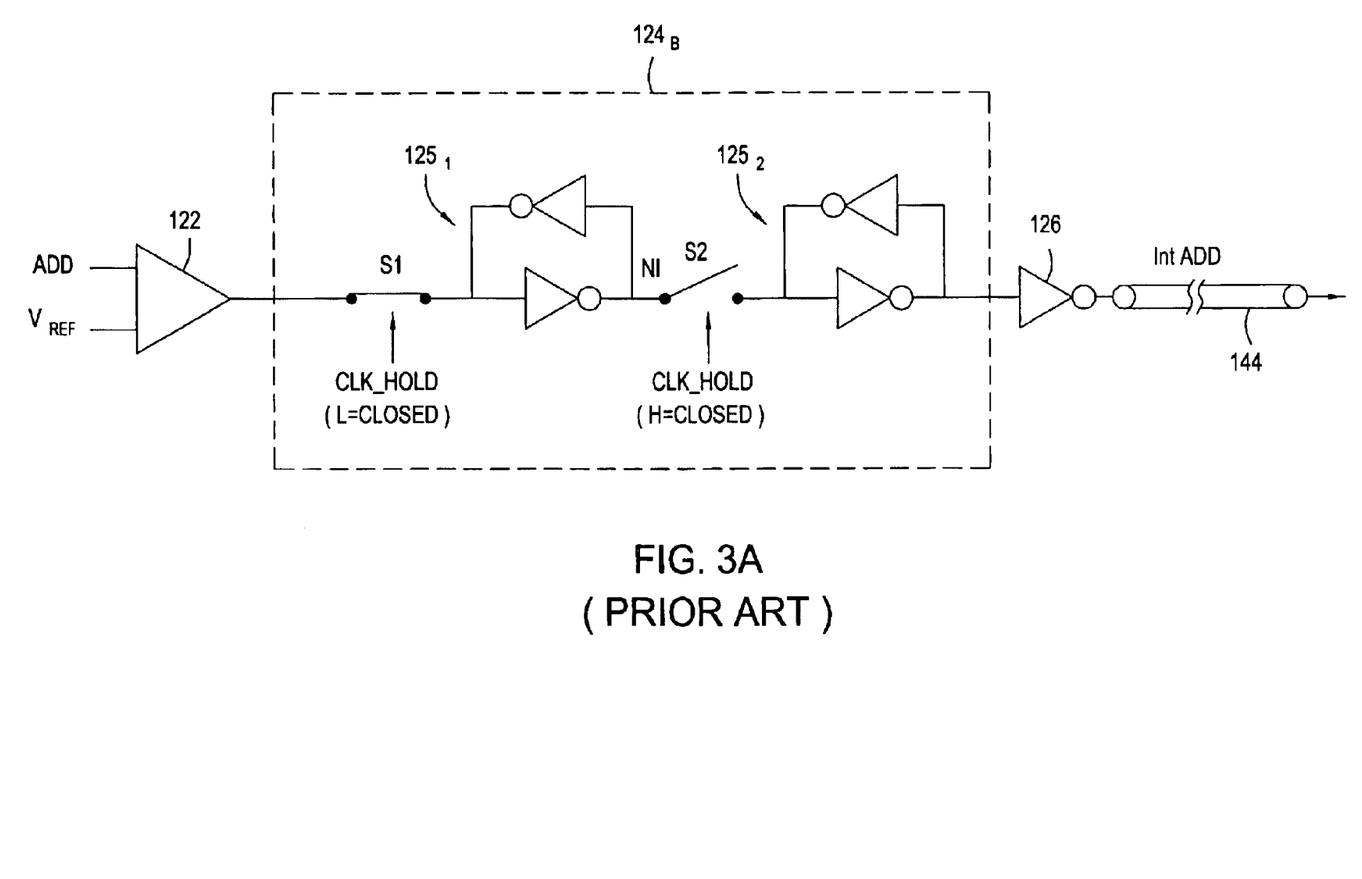
FIGS. 3A and 3B illustrate a conventional full latch circuit and a corresponding timing diagram, respectively.

This problem associated with invalid addresses may be overcome by utilizing a full latch circuit, such as the latch circuit 124B illustrated in FIG. 3A. The latch circuit 124B may be considered as having two stages, each with a pair of cross coupled inverters ($125_1$ and $125_2$). As illustrated, the latch circuit 124B may utilize a second switch S2 (selectively coupling the first and second stages), that operates in a complementary fashion to switch S1. For example, when CLK_HOLD is low, switch S2 is closed and data at the input reaches an intermediate node (N1), but is prevented from reaching the driver 126 by switch S2, which is open. When CLK_HOLD is high, S1 opens, latching the data at the input which is then applied to the driver 126 as S2 is closed.

Figure 3B:
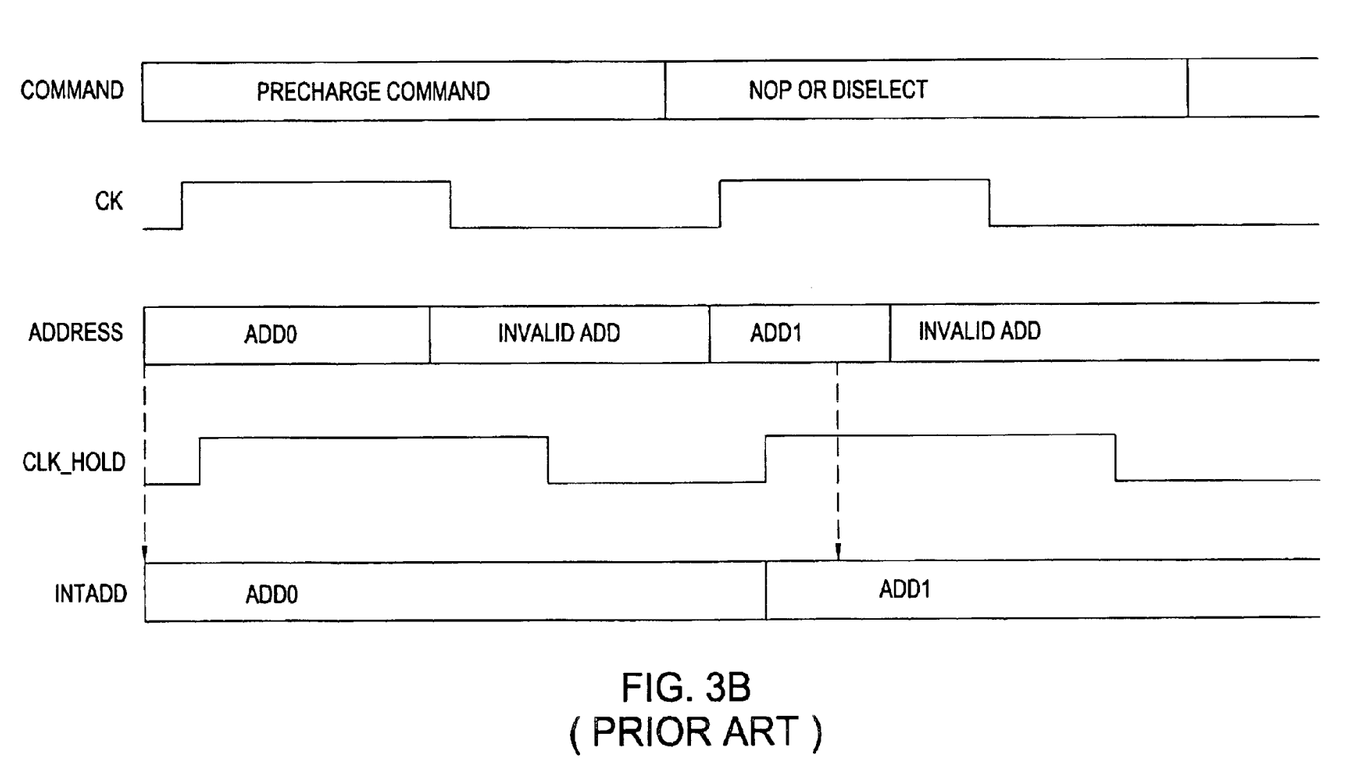

As illustrated in the timing diagram of FIG. 3B, the full latch circuit 124B prevents invalid addresses between valid addresses from toggling the driver 126. However, invalid commands applied to the memory device may still result the output toggling of output driver 126. For example, as illustrated in FIG. 3B, invalid commands, such as No Operation (NOP) and Device Deselect (DIS), may still result in the latching of different addresses.

Because memory devices typically perform no operations in response to the invalid commands and, therefore, do not require valid addresses, toggling the output drivers 126 is unnecessary and results in increased current consumption. This current consumption may constitute a significant portion of total current consumption in both standby and active non-power down modes (often referred to as IDD2N and IDD3N currents, respectively). In fact, worst cases of IDD2N and IDD3N are typically achieved during test procedures that utilize test patterns that toggle address signals, while applying NOP and DESELECT commands. Such test patterns are designed to maximize the number of times the output drivers 126 are toggled in an effort to determine a worst case current for a device being tested.

Accordingly, there is a need for techniques and apparatus for reducing current consumption in a memory device.

SUMMARY OF THE INVENTION

The present invention generally provides methods and apparatus for preventing the unnecessary switching of latched outputs One embodiment provides a method for reducing power consumption of an integrated circuit device. The method generally includes receiving a first command issued to the device, receiving a first input signal by a latch circuit in conjunction with the first command, latching the first input signal with the latch circuit in response to determining the first command is a command considered valid, receiving a second command issued to the device, receiving a second input signal by the latch circuit in conjunction with the second command, and preventing the latch circuit from latching the second input signal in response to determining the second command is a command considered invalid.

Another embodiment provides an integrated circuit device generally including a command interface for receiving commands issued to the device, one or more latch circuits for receiving input signals in conjunction with corresponding commands received by the interface, and control circuitry. The control circuitry is generally configured to generate one or more latch control signals to cause the latch circuits to latch the input signals only if the corresponding commands are commands considered valid.

Another embodiment provides a memory device generally including one or more address receivers for receiving address signals driven on an external address bus in conjunction with commands issued to the device, one or more address latch circuits for latching address signals received by the address receivers and supplying address signals to corresponding output drivers, control circuitry and an invalid command detector. The control circuitry is generally configured to generate at least one latch control signal to cause the address latch circuits to supply first address signals to the corresponding output drivers if corresponding first commands are commands considered valid. The invalid command detector is generally configured to generate a signal to inhibit the latch control signal to prevent the address latch circuits from supplying second address signals to the corresponding output drivers if corresponding second commands are commands considered invalid.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments of the present invention generally provide a latch circuit for use in a memory device that reduces unnecessary toggling of output drivers. Unnecessary toggling of the output drivers may be reduced by preventing the output of the latch circuit from changing when an invalid command is detected. By reducing unnecessary toggling of output drivers, embodiments of the present invention may be utilized to significantly reduce current consumption in memory devices during both standby and active modes.

As used herein, the term invalid command generally refers to commands that correspond to no specific action to be taken by the device receiving the command. For example, in a memory device, such as a DRAM device, No Operation (NOP) and Device Deselect (DIS) commands may be considered invalid commands. Embodiments of the present invention may also be used to prevent unnecessary toggling of drivers when other types of commands that do not require valid addresses are applied. One skilled in the art will recognize that buffer circuits described herein may be utilized to advantage in a variety of different integrated circuit devices, particularly addressable devices, including, but not limited to memory devices, such as DRAM devices, digital signal processors (DSPs), and the like.

An Exemplary Memory Device

Figure 4:
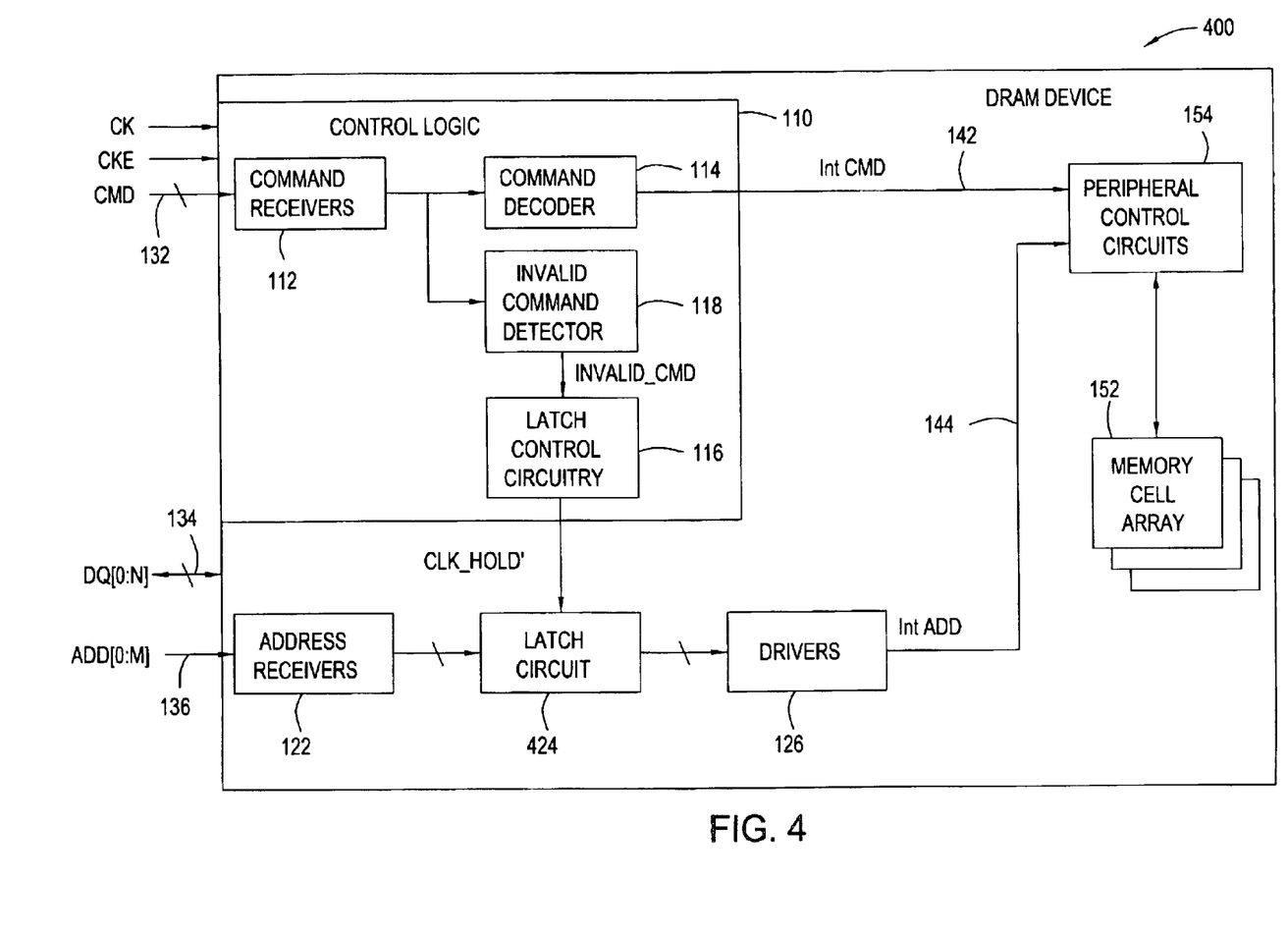
FIG. 4 illustrates a memory device in accordance with one embodiment of the present invention.

FIG. 4 illustrates an exemplary memory device 400 (e.g., a DRAM device) utilizing latch circuits 424 in accordance with one embodiment of the present invention. As illustrated, control logic 110 of the memory device 400 may include an invalid command detector 118, which may be configured to generate a signal (INVALID_CMD) in response to detecting invalid commands. Latch control circuitry 118 may utilize the INVALID_CMD signal to generate a new control signal CLK_HOLD' (e.g, based on clock signal CK) that allows the latch circuit 424 to toggle an output driver 126 only when valid commands are applied to the memory device 400. Operation of the invalid command detector 118 and utilization of the new control signal CLK_HOLD' will be described in further detail below with reference to FIGS. 5A–B and FIGS. 6A–B.

Figure 5A:
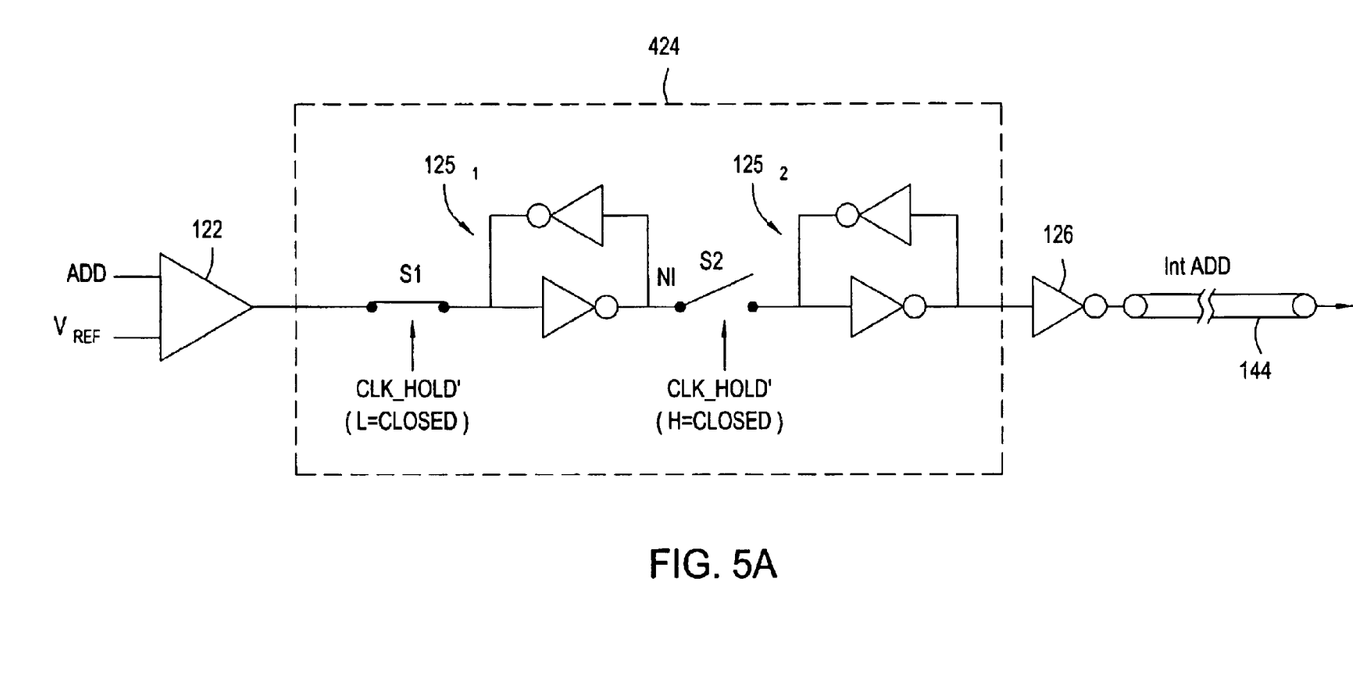
FIGS. 5A and 5B illustrate a latch circuit and a corresponding timing diagram, respectively, in accordance with one embodiment of the present invention.
Figure 5B:
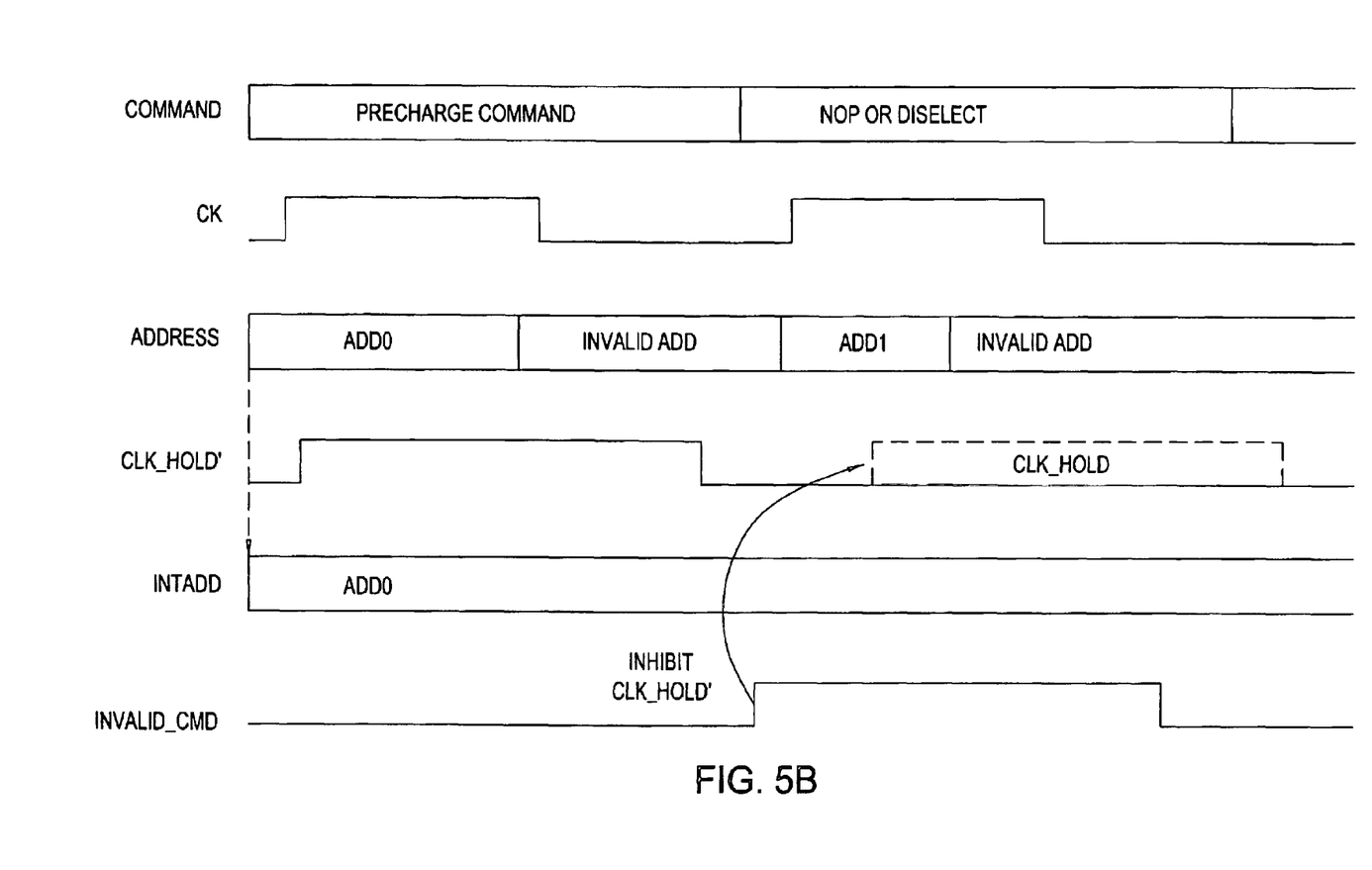

FIGS. 5A and 5B illustrate an exemplary schematic diagram of one embodiment of the latch circuit 424 and a corresponding timing diagram, respectively. The latch circuit 424 may operate in a similar manner to the full latch circuit 124B described above with reference to FIGS. 3A–3B, but with the switches S1 and S2 controlled by the new latch control signal CLK_HOLD'. In other words, when CLK_HOLD' is low, switch S1 may be closed, allowing data at the input to reach an intermediate node NI, while S2 is open, decoupling the intermediate node NI from the output and preventing the data from toggling the output driver. When CLK_HOLD' is high, S1 opens, latching the data at the input which is then applied to the output driver 126 as S2 is closed. Accordingly, as illustrated in the timing diagram of FIG. 5B, the latch circuit 424 prevents invalid addresses between valid addresses from toggling the output driver 126.

In addition to preventing unnecessary toggling of output driver 126 due to invalid addresses, controlling the latch circuit 424 with CLK_HOLD' may also prevent invalid commands applied to the memory device 400 from toggling the output driver 126. As illustrated in FIG. 5B, CLK_HOLD' may be asserted only when valid commands are applied. In other words, when invalid commands are applied, CLK_HOLD' remains de-asserted when the conventional CLK_HOLD signal would normally be asserted (as illustrated by dashed lines in FIG. 5B), thus preventing the latch circuit 424 from latching data, shown as new address ADD1, to its output. Thus, the address on the internal address bus remains ADD0.

As previously described, commands are typically applied to the memory device 400 via signals issued on command bus 132. In other words, the state of signals applied to individual lines of the command bus 132 (typically on a rising edge of the clock signal CK) define the command. TABLE I below illustrates a few common commands for a DRAM device, including invalid NOP and DIS commands, along with the corresponding states of the typical command signals and required address signals. In the table, L, H, V, and X stand for logic low, logic high, valid, and "Don't Care," respectively.

TABLE I

EXEMPLARY COMMANDS

| COMMAND | CS/ | RAS/ | CAS/ | WE/ | ADDR |
|---|---|---|---|---|---|
| Bank Active | L | L | H | H | V |
| Read | L | H | L | H | V |
| No Operation (NOP) | L | H | H | H | X |
| Device Deselect (DIS) | H | X | X | X | X |

Figure 6A:
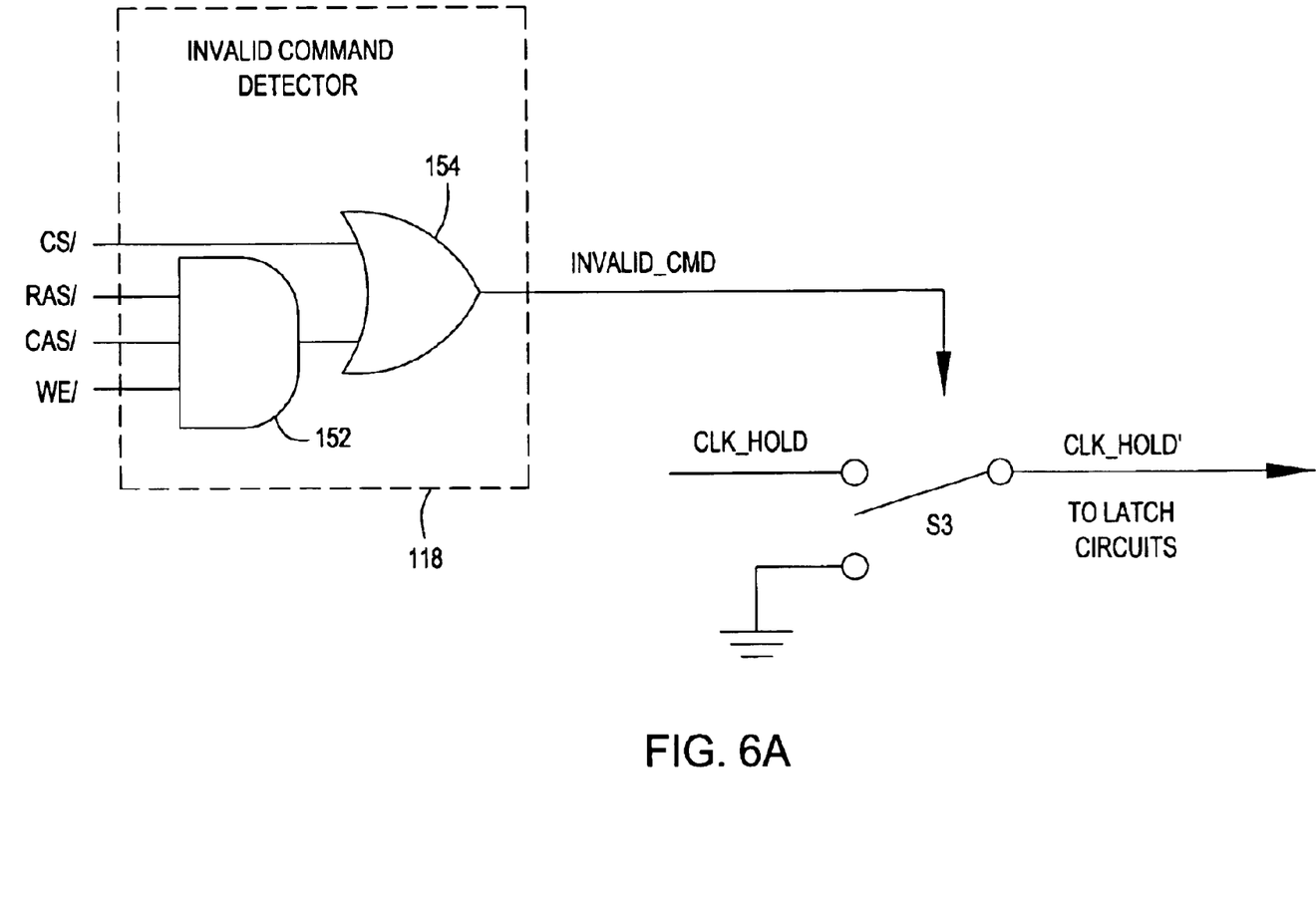
FIGS. 6A and 6B illustrate an invalid command detector and a corresponding timing diagram, respectively, in accordance with one embodiment of the present invention.

Because the state of the command signals for any given command is predefined, the invalid command detector 118 may be constructed with logic circuitry that decodes the command signals. For example, FIG. 6A illustrates an exemplary implementation of an invalid command detector 118 that may be used to detect NOP and DIS commands shown in TABLE I. Since RAS/, CAS/, and WE/ are all high for a NOP command, the NOP command can be detected by a three input AND gate 152. The DIS command can also be detected by a high CS/ signal, so that the INVALID_CMD signal can be generated by an OR gate 154 receiving as input the CS/ signal and the output of the AND gate 152. In other words, the output of OR gate 154 is high (asserting the INVALID_CMD signal) when CS/ is high or when RAS/, CAS/, and WE/ are all high.

Figure 6B:
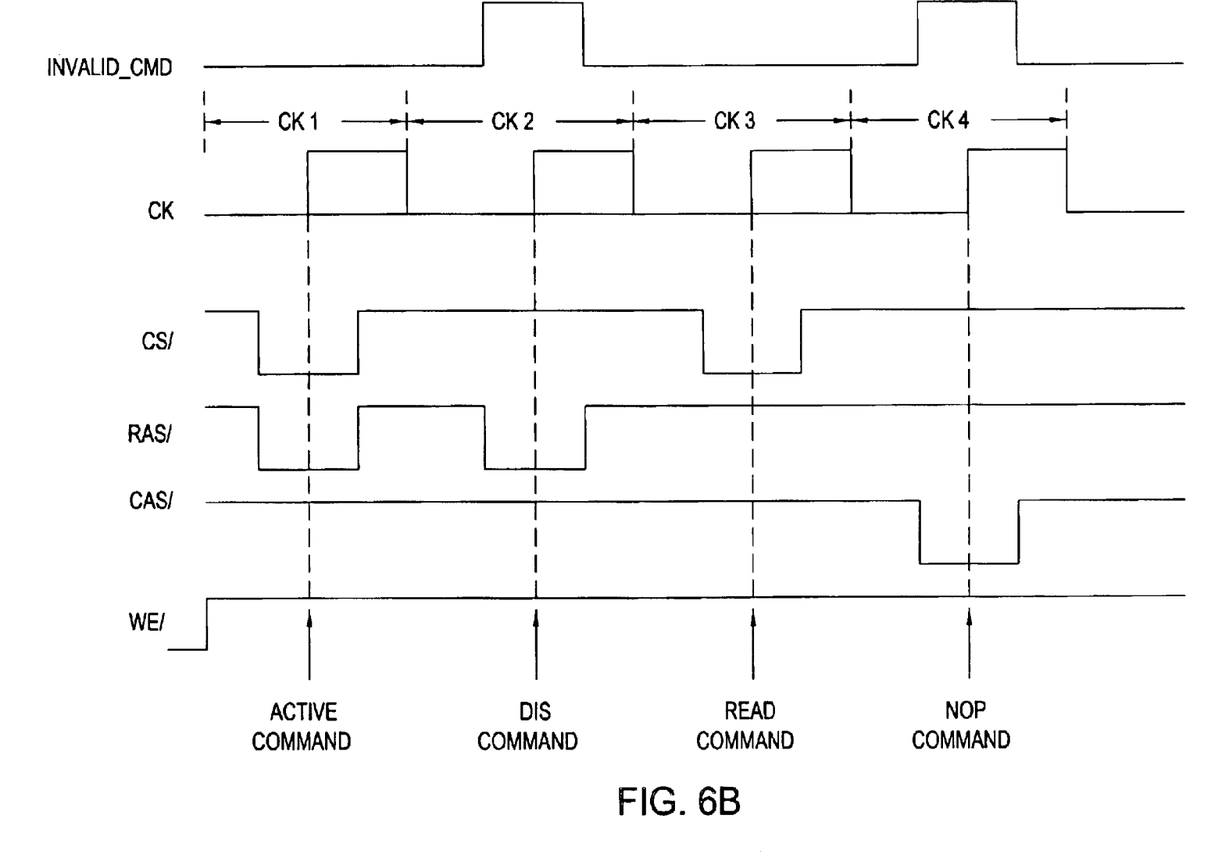

FIG. 6B illustrates an exemplary timing diagram showing the state of the INVALID_CMD signal generated by the invalid command detector 118, as various commands are applied. As illustrated, the INVALID_CMD signal is de-asserted when valid Active and Read commands are applied (at clock cycles CK1 and CK3). The INALID_CMD signal is asserted, however, when invalid commands NOP and DIS are applied (at clock cycles CK2 and CK4).

Referring again to FIG. 6A, the INVALID_CMD signal may be combined with a conventional CLK_HOLD signal to generate the new latch control signal CLK_HOLD'. As illustrated, for one embodiment, the INVALID_CMD signal may be used to control a switch S3. As illustrated, when valid commands are detected (INVALID_CMD signal de-asserted), the switch S3 may connect a CLK_HOLD' output to a CLK_HOLD input, such that CLK_HOLD' functions as a conventional CLK_HOLD. On the other hand, when invalid commands are detected (INVALID_CMD signal asserted), CLK_HOLD' may be de-asserted, for example, by connecting the CLK_HOLD' output to ground via the switch S3.

Of course, one skilled in the art will recognize that the various circuit elements and arrangements shown in the figures and described herein (e.g., the switch S3, AND gate 152 and OR gate 154 of FIG. 6A) are exemplary only and many different such arrangements may constructed to perform similar functions. Further, the various circuit elements may be implemented using any suitable combination of components, such as transistors (e.g., NMOS and PMOS), transfer gates, and the like.

CONCLUSION

Embodiments of the present invention may be utilized to reduce unnecessary switching of latched outputs, which may reduce current consumption. Because there are typically a relatively large number of address lines and corresponding latches in a memory device, significant reductions in standby and active current consumption may be realized utilizing the techniques and circuits described herein to prevent the output drivers of address latches from toggling. One skilled in the art will recognize, however, that embodiments of the present invention are not restricted to address latches and may also be applied to other types of latches. As an example, command latches (e.g., associated with a command decoder) may also utilize the techniques and circuits described herein to reduce current consumption from unnecessary toggling of corresponding output drivers when invalid commands are issued.

While the foregoing is directed to embodiments of the present invention, other and further embodiments of the invention may be devised without departing from the basic scope thereof, and the scope thereof is determined by the claims that follow.

What is claimed is:

1. A method for reducing power consumption of an integrated circuit device, comprising:
   receiving a command issued to the device;
   receiving an input signal by a latch circuit in conjunction with the command;
   determining if the command is an invalid command; and
   latching the first input signal with the latch circuit only if it is determined the command is not invalid.

2. The method of claim 1, wherein determining if the command is an invalid command comprises determining NOP (no operation) and DIS (device deselect) commands are invalid commands.

3. The method of claim 1, wherein the device is a memory device and the latch circuit is an address latch circuit.

4. The method of claim 1, wherein latching the input signal with the latch circuit comprises asserting a latch control signal.

5. The method of claim 4, further comprising preventing the latch circuit from latching the input signal in response to determining the command is invalid by de-asserting the latch control signal.

6. The method of claim 5, wherein de-asserting the latch control signal comprises generating an invalid command signal in response to determining the command is invalid.

7. An integrated circuit device, comprising:
   a command interface for receiving commands issued to the device;
   one or more latch circuits for receiving input signals in conjunction with corresponding commands received by the interface; and
   control circuitry configured to determine if the corresponding commands are valid and generate one or more latch control signals to cause the latch circuits to latch the input signals only if the corresponding commands are valid.

8. The device of claim 7, wherein the input signals comprise address signals.

9. The device of claim 7, wherein the input signals comprise one or more command signals.

10. The device of claim 7, wherein the latch circuits comprise:
    an input for receiving an input signal;
    at least two stages of cross-coupled inverters;
    a first switch configured to couple the input to the first stage when a latch control signal is at a first logic state and to decouple the input from the first stage when the latch control signal is at a second logic state; and
    a second switch configured to couple an output of the first stage to the second stage when the latch control signal is at the second logic state and to decouple the second stage from the first stage when the latch control signal is at the first logic state.

11. The device of claim 10, wherein the control circuitry is configured to place or maintain the latch control signal in the first logic stage when an invalid command is detected.

12. The device of claim 7, wherein the command interface comprises a command bus to receive one or more command signals.

13. The device of claim 12, wherein the control circuitry comprises detection circuitry to decode the command signals and generate an invalid command signal in response to detecting a command considered invalid.

14. A memory device, comprising:
   one or more address receivers for receiving address signals driven on an external address bus in conjunction with commands issued to the device;
   one or more address latch circuits for latching address signals received by the address receivers and supplying address signals to corresponding output drivers;
   control circuitry configured to generate at least one latch control signal to cause the address latch circuits to supply first address signals to the corresponding output drivers if corresponding first commands are valid; and
   an invalid command detector to generate a signal to inhibit the latch control signal to prevent the address latch circuits from supplying second address signals to the corresponding output drivers if corresponding second commands are invalid.

15. The device of claim 14, wherein the memory device further comprises one or more command latch circuits for latching command signals responsive to the latch control signal generated by the control circuitry.

16. The device of claim 14, wherein the invalid command detector receives, as in input, a chip select signal.

17. The device of claim 14, wherein the address latch circuits comprise:
   at least two stages of cross-coupled inverters;
   a first switch configured to couple an output of an address receiver to the first stage when the latch control signal is at a first logic state and to decouple the output of the address receiver from the first stage when the latch control signal is at a second logic state; and
   a second switch configured to couple an output of the first stage to the second stage when the latch control signal is at the second logic state and to decouple the second stage from the first stage when the latch control signal is at the first logic state.

18. The device of claim 17, wherein the control circuitry is configured to place or maintain the latch control signal in the first logic stage when an invalid command signal is asserted by the invalid command detector.

19. The device of claim 18, wherein the control circuitry comprises a switch controlled by the invalid command signal.

20. The device of claim 18, wherein the invalid command detector asserts the invalid command signal in response to detecting at least one of a NOP (no operation) command and a DIS (device deselect) command.

* * * * *